United States Patent [19]

Karpovich et al.

[11] Patent Number: 5,510,629

[45] Date of Patent: Apr. 23, 1996

[54] MULTILAYER ANTIFUSE WITH INTERMEDIATE SPACER LAYER

[75] Inventors: Yakov Karpovich, Campbell; Ali A. Iranmanesh, Sunnyvale, both of Calif.

[73] Assignee: Crosspoint Solutions, Inc., Santa Clara, Calif.

[21] Appl. No.: 250,068

[22] Filed: May 27, 1994

[51] Int. Cl.⁶ .......................... H01L 29/04; H01L 31/036
[52] U.S. Cl. ............................................. 257/50; 257/530
[58] Field of Search ............................. 257/530, 50, 209

[56] References Cited

U.S. PATENT DOCUMENTS

| | | | |
|---|---|---|---|
| 3,675,090 | 7/1972 | Neale | 257/4 |
| 5,381,035 | 1/1995 | Chen et al. | 257/530 |

FOREIGN PATENT DOCUMENTS

WO/9213359  8/1992  WIPO .

*Primary Examiner*—Jerome Jackson, Jr.
*Assistant Examiner*—John Guay
*Attorney, Agent, or Firm*—Townsend and Townsend and Crew

[57] ABSTRACT

A method and structure for an improved antifuse in an integrated circuit having a sacrificial layer under a programming layer which forces a conductive link upon programming to be formed away from corner regions of the via structures. The method includes the unique step of forming an improved aperture or via with sides through an inter dielectric layer where the antifuse is to be located. The improved aperture or via exposes a portion of a metal interconnection line through a portion of sacrificial layer located away from the inter dielectric layer sides. Such improved method of forming the antifuse also provides a superior antifuse structure.

20 Claims, 5 Drawing Sheets

5,510,629

1

MULTILAYER ANTIFUSE WITH INTERMEDIATE SPACER LAYER

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer of antifuse material, such as amorphous silicon, silicon dioxide or silicon nitride, is sandwiched between two metal interconnection lines. Depending upon the material of each metal interconnection layer, a layer of barrier metal, such as TiW (titanium-tungsten), is placed between the programming layer and each metal interconnection layer. Barrier metal layers function to block the undesired interdiffusion of material from a programming layer, such as amorphous silicon, and material from a metal layer, such as aluminum alloy. Barrier metal layers are typically refractory metals, their intermetallics, alloys, silicides, nitrides and combinations thereof.

Various problems have been found with present day antifuses. One problem is that the programmed resistance ($R_{ON}$) typically varies between 30 to 150 ohms depending upon the current used to program the antifuse. While these values are low enough for FPGA's to operate quite adequately, even lower resistance values would significantly improve performance. Thus a goal of any antifuse is to lower $R_{ON}$ as much as possible. Furthermore, it is highly desirable that the range of resistance values be decreased so that the performance of the FPGA be more predictable.

A second problem with present antifuses is that voltages to program the antifuses tend to vary widely. Circuit and process designs must be made to accommodate these variations, which adversely affect the cost and performance of the integrated circuit incorporating these antifuses.

The present invention solves or substantially mitigates these problems. A further advantage is that the present invention can be incorporated into existing antifuse processes without radical and expensive changes.

SUMMARY OF THE INVENTION

The present invention provides an improved antifuse structure and its method of manufacture. Such improved antifuse provides an improved conducting link by moving the link structure from the corner to a center region of the via structure. The improved antifuse includes benefits such as a lower resistance upon programming, a tighter distribution of lower programming voltage, and a more reliable conductive link. These benefits are achieved in the context of known process technology.

The present invention provides an improved method of forming an antifuse in an integrated circuit having a first insulating layer on a semiconductor substrate. The method

2 includes forming a first metal interconnection line on the first insulating layer and a sacrificial layer on the first metal interconnection line. The method then provides forming a second insulating layer or dielectric layer over the first metal interconnection line. An aperture, or via, with sides through the second insulating layer where the antifuse is to be located is then formed by dry etching. Depending upon the amount of etching, the sacrificial layer via exposes either a top surface portion of the first metal interconnection line through a portion of the sacrificial layer to form a relatively flat portion located away from the second insulating layer sides, or the aperture forms a thinner relatively flat portion of sacrificial layer by evenly etching a portion of sacrificial layer located away from the second insulating layer sides. The method further includes the steps of forming a programming layer on the second insulating layer and the relatively flat portion in the aperture, and forming a second metal interconnection line on the programming layer. The programming layer overlying the sacrificial layer portion near the via sides which is thicker and the relatively flat portion promotes link formation over such exposed portion upon programming.

In an alternative embodiment, the improved method includes a barrier metal layer overlying an aluminum alloy layer for the first interconnection line. Optionally, the improved method also provides a step of forming a thin etch stop layer on the barrier metal layer. The thin etch stop layer protects the underlying barrier metal during the etching of the dielectric layer in forming the via structures. Such etch stop is important when uneven or rough barrier metal surfaces are created after etching through the dielectric layer and sacrificial layer. Rough or uneven barrier metal surfaces generally prevent the substantially even formation of an overlying programming layer which is necessary for reliable antifuse structures.

Another embodiment of the present invention provides an improved antifuse structure in an integrated circuit having a sacrificial layer which promotes the formation of the conductive link near a center portion of the via upon programming. The improved antifuse structure includes a first interconnection line and a second interconnection line formed over the first interconnection line. The improved antifuse structure also has an aperture or via including sides formed through the second insulating layer where the antifuse is to be located. Such aperture or via exposes a portion of the first metal interconnection line through a portion of the sacrificial layer located away from the sides to create a relatively flat portion. Alternatively, the aperture forms a thinner relatively flat portion of sacrificial layer by evenly etching a portion of sacrificial layer located away from the second insulating layer sides. A programming layer is then formed on the second insulating layer and the relatively flat portion in the aperture. The completed antifuse includes a second metal interconnection line on the programming layer.

Still a further embodiment of the improved antifuse structure includes a barrier metal layer overlying an aluminum alloy layer for the first interconnection line. The improved antifuse structure also provides a thin etch stop layer over the barrier metal layer. As noted, the etch stop layer protects the underlying barrier metal layer during etching of the dielectric layer when forming the vias. Such etch stop layer is important when etching through the dielectric layer and sacrificial layer in forming vias creates uneven or rough barrier metal surfaces. As further noted, rough or uneven barrier metal surfaces prevent the even formation of an overlying programming layer which is necessary for reliable antifuse structures.

A further understanding of the nature and advantages of the present invention may be realized by reference to the latter portions of the specification and attached drawings.

BRIEF DESCRIPTION OF THE DRAWINGS

A more detailed understanding of the present invention may be achieved by perusing the following Description of Specific Embodiments of the present invention with reference to the following drawings.

DESCRIPTION OF SPECIFIC EMBODIMENTS

Figure 1A:
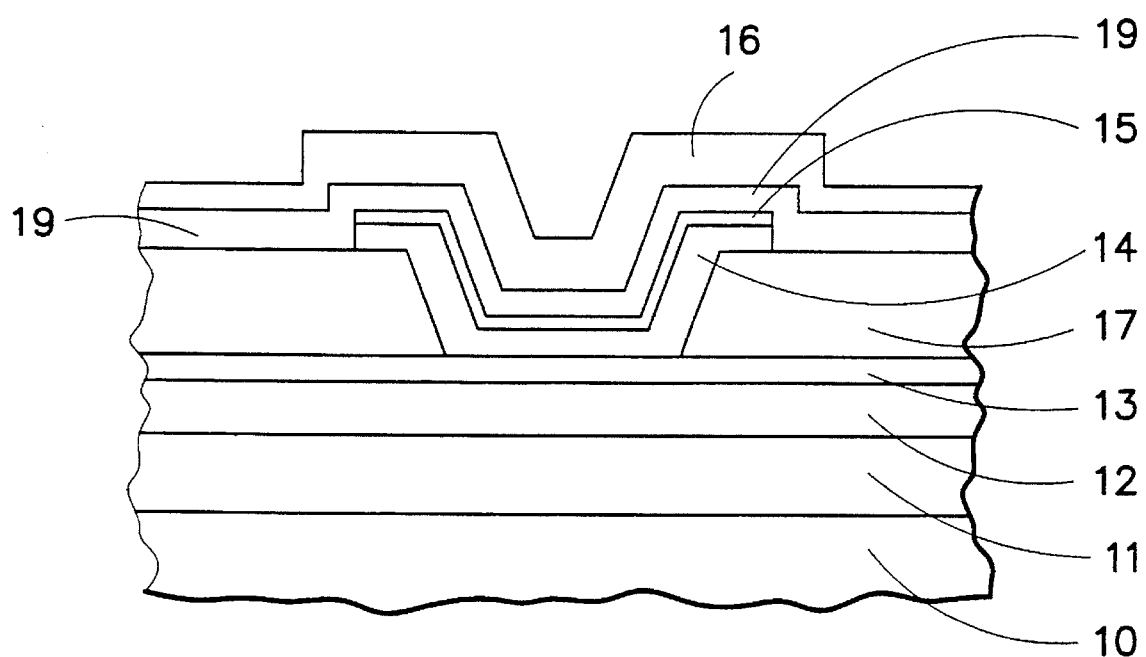
FIG. 1A is a cross-sectional diagram of a representative antifuse found in the prior art.

FIG. 1A shows a cross-sectional view of a typical antifuse. The antifuse has a first metal interconnection layer 12 on top of an insulating layer 11 of silicon dioxide. Insulating layer 11 is formed on top of a semiconductor substrate 10 upon whose surface are formed various elements of an integrated circuit. These elements, such as transistors, are not shown in the drawings.

First metal interconnection layer 12 is typically formed from aluminum alloy. A first barrier metal layer 13 is formed on top of first metal interconnection layer 12. Layers 12 and 13 are delineated into one set of metal interconnection lines for the integrated circuit. A second insulating layer 17 of silicon dioxide is placed over first metal interconnection layer 12 and first barrier metal layer 13. Through an aperture, or via, through layer 17, a programming layer 14 of amorphous silicon is formed on top of second insulating layer 17 and in the via to contact first barrier metal layer 13. As explained above, barrier metal layer 13 prevents the interdiffusion of the aluminum in metal interconnection layer 12 with the silicon in programming layer 14.

On top of the programming layer 14, there is placed a thin barrier metal layer 15. An antifuse mask is used to delineate the layers 14 and 15 in the via and its surrounding regions. A third barrier metal layer 19, which is followed by a second metal interconnection layer 16 of aluminum, is deposited in contact with the barrier metal layer 15 and the edge of the programming layer 14. The layers 16 and 19 are delineated into another set of metal interconnection lines for the integrated circuit.

When an antifuse is programmed by placing a desired voltage across the metal interconnection lines (the layers 12, 13 and the layers 16, 19), a conducting link is formed through the previously nonconducting programming layer 14 between the barrier metal layers 13 and 15. The link is typically at the corners of the antifuse in the via through insulating layer 17. The conducting link is formed by the higher electric fields at the corners at the beginning of the programming process. These fields cause a breakdown of programming layer 14 in those locations and the resulting high current densities melt barrier metal layers 13 and/or 15 and intermediate programming layer 14 of amorphous silicon into the fused link.

As noted above, there are at least two problems with present day antifuses. The resistance of the programmed antifuse varies considerably. The source of this problem appears to be the location of the conducting link. It is believed that the conductivity, or conversely, the resistance, of the programmed link is determined by the amount of barrier metal which combines with the silicon in programming layer 14 to form the conducting metal silicide link. Since the link is located at the corner, there is a limited amount of barrier metal available, compared to a location near the center of the via. In the via center the silicide link can draw metal from adjacent barrier metal regions so that more metal can be combined for the link with lower resistance and greater reliability.

Figure 1B:
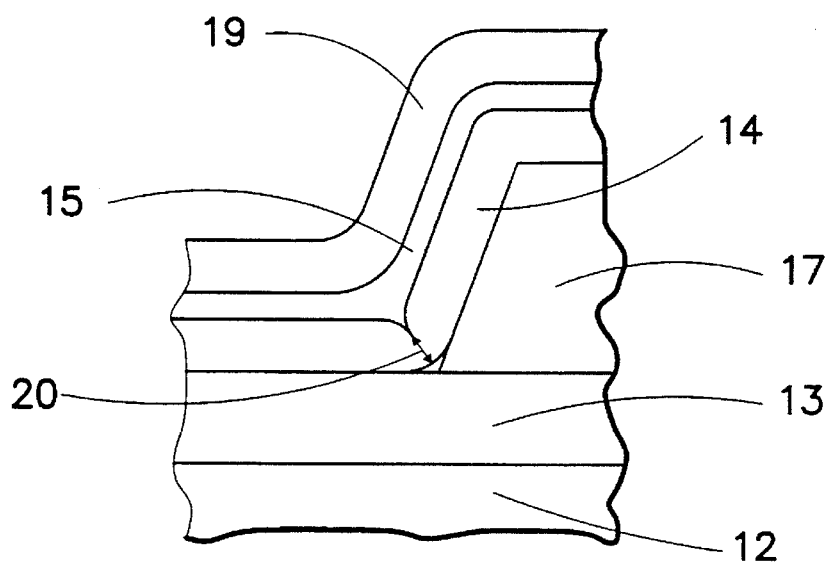
FIG. 1B is a detailed view of one corner of the antifuse of FIG. 1A.

Secondly, the uneven deposition of programming layer 14 of amorphous silicon at the corners of the via, as shown in FIG. 1B, which details a corner of the antifuse in FIG. 1A, is believed to be the source of the wide variation in programming voltages. As can be seen, most of programming layer 14 has a rather uniform thickness, except at the via corner where insulating layer 17 and barrier layer 13 meet. At this point, the abrupt change from the horizontal top of barrier metal layer 13 to the steeply sloped sides of the antifuse aperture in insulating layer 17 causes an irregularity in programming layer 14, which is a consequence of chemical vapor deposition used to form programming layer 14.

As shown in FIG. 1B, the irregularity in programming layer 14 is a crease at the corner with mounds on either side. In the programming of the antifuse, programming layer 14 melts in the corner region. Specifically, the rupture occurs in the crease where programming layer 14 is thinnest. Dotted arrow 20 shows the distance of the thinnest portion of the programming layer 14 at the corner of the antifuse structure. The thickness of programming layer 14 at this point is difficult to control and is very much subject to the vagaries of semiconductor processing. Hence, there is no uniformity in thickness at this point from wafer to wafer or even from antifuse to antifuse within an integrated circuit. With this variation in thickness, the programming voltages necessarily also vary.

It is also believed that upon the programming of antifuses, the conductive link includes small dendrite links of metal forming the link. Some of the dendrite links form extra thin branches. Over time, the operational currents passing through these dendrite branches cause the branches to breakdown and melt. The branches reform with higher resistances. Thus some of the programmed antifuses are therefore unreliable.

The present invention moves the programming point away from the corners of the via through insulating layer 17 by creating a sacrificial layer or spacer under (or near) the via corners. The result is that programming layer 14 is thickest at the corners and thinnest at portions near the center of the via. The thickness of programming layer 14 in this center portion may be controlled with much greater effectiveness than at the via corners.

Figure 2:
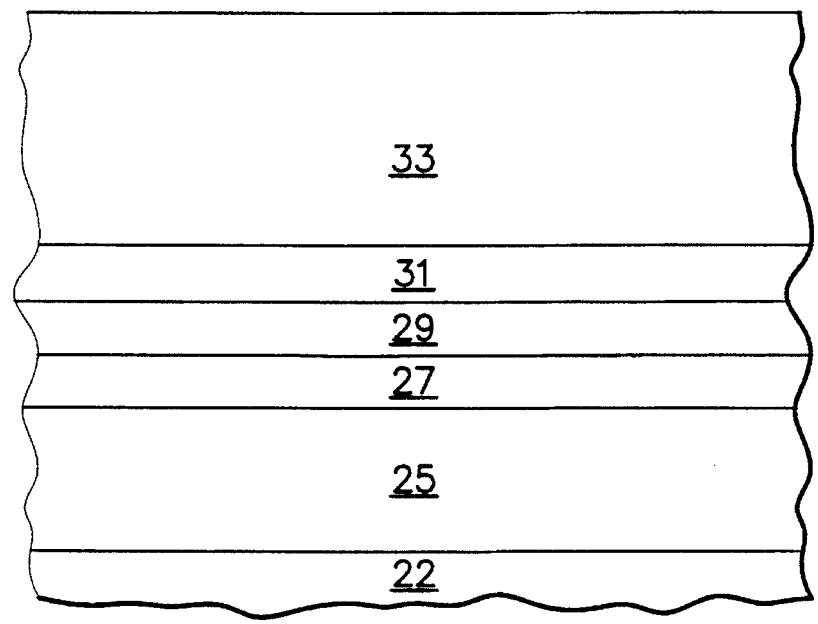
FIGS. 2–4 show a sequence of steps used to manufacture an antifuse structure according to one embodiment of the present invention.
Figure 3:
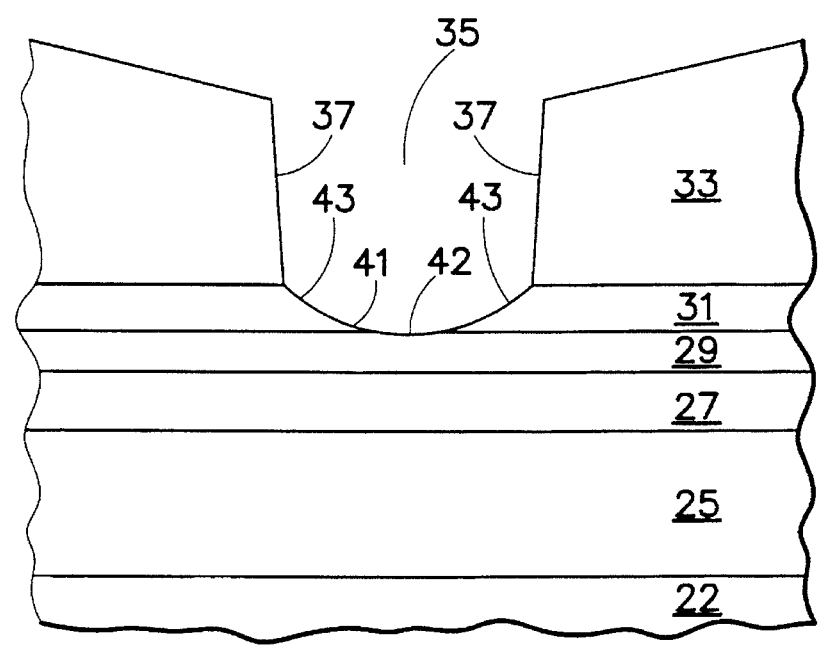
Figure 4:
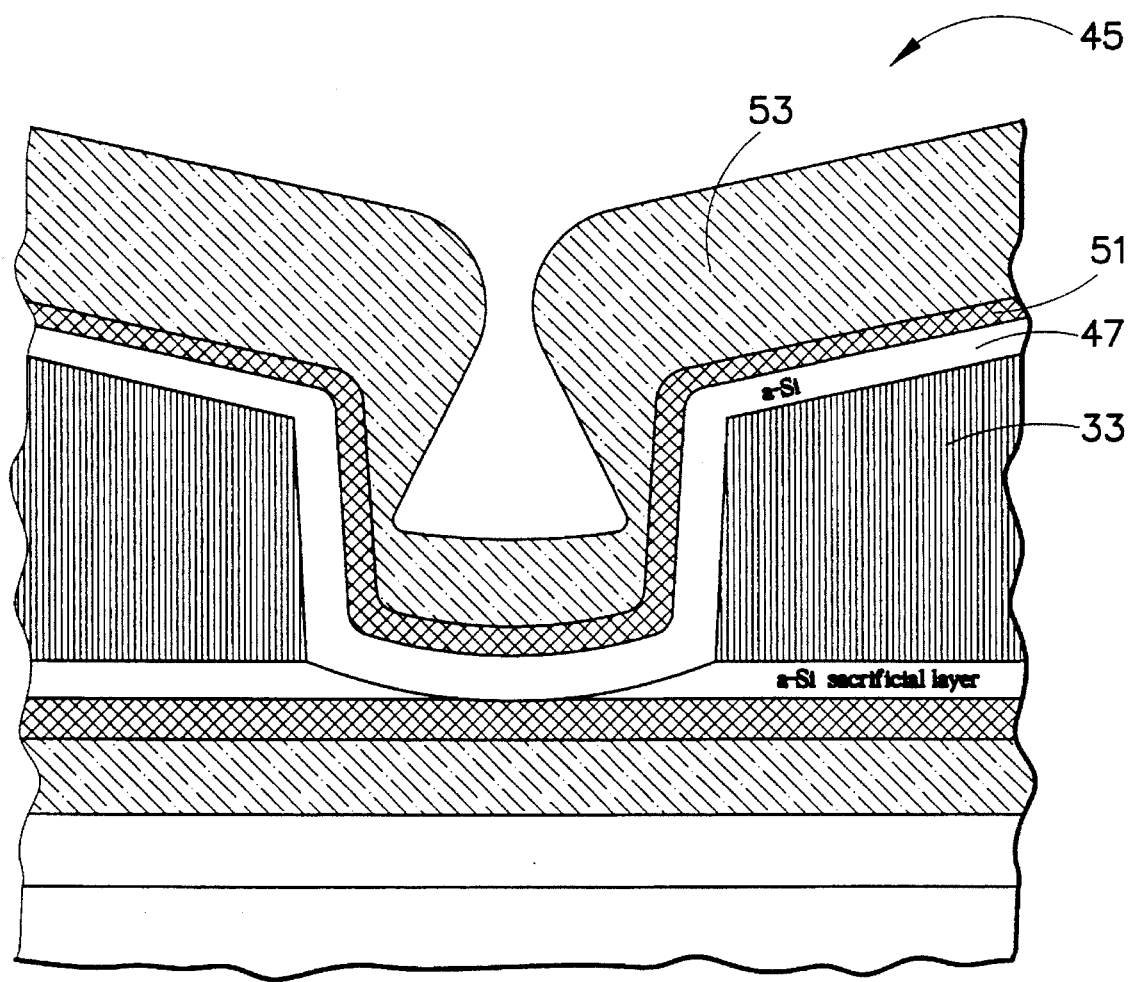

FIGS. 2–4 illustrate the steps of manufacturing an improved antifuse structure according to one embodiment of the present invention. It should be noted that similar masks for the antifuse illustrated in FIG. 1A may be used so that the present invention may be easily adapted to existing antifuse processes. The improved antifuse has a first metal interconnection layer 25 on top of an insulating layer 22, such as silicon dioxide, as shown in FIG. 2. The insulating layer 22 is formed on top of a semiconductor substrate 20 upon whose surface are formed various elements of an integrated circuit. Typically, first metal interconnection layer 25 includes metallization such as aluminum alloyed with a small concentration of copper and silicon. A barrier metal layer 27 is formed overlying first metal interconnection layer 25. Barrier metal layer 27 is generally a refractory metal such as titanium-tungsten or the like. A titanium-tungsten barrier metal layer may include a thickness from about 1,000 to 2,000 Å, and preferably about 1,500 Å.

FIG. 2 further illustrates sacrificial layer 31 formed overlying barrier metal layer 27 and under dielectric layer 33. Dielectric layer 33 includes materials such as undoped silicate glass, borophosphosilicate glass (BPSG) or phosphosilicate glass (PSG) which is deposited by for example chemical vapor deposition to a thickness ranging from about 5,000 to 10,000 Å over insulating layer 22, sacrificial layer 31, and metal layers 25, 27. During a subsequent etching step forming vias through the layer 33, sacrificial layer 31 prevents sharp corners from developing near the via sides or corners. Such sharp corners were illustrated by FIG. 1B in the prior art antifuse structure. By preventing sharp corners from developing near via sides, the programming point occurs near a center region of the via structure.

Sacrificial layer 31 in the present embodiment includes an amorphous silicon material. Alternatively, sacrificial layer 31 may be made from other materials including silicon dioxide and undoped polysilicon. Of course, the material used for sacrificial layer 31 depends on the materials of the programming layer and dielectric layer 33. The thickness of sacrificial layer 31 comprising amorphous silicon is about 100 to 500 Å, and preferably about 350 Å.

Optionally, a thin layer of aluminum 29 or other suitable material is formed between barrier metal layer 27 and sacrificial layer 31. Such thin layer of aluminum about 200 to 400 Å in thickness acts as an etch stop (or an etch stop layer) when forming vias in the dielectric or insulating layer corresponding to the antifuse site. The thin etch stop layer 29 protects the underlying barrier metal 29 during the etching of the dielectric layer 33 in forming the via structures. Such etch stop is important when uneven or rough barrier metal surfaces are created after etching through the dielectric layer and sacrificial layer. Rough or uneven barrier metal surfaces generally prevent the substantially even formation of an overlying programming layer which is necessary for reliable antifuse structures.

FIG. 3 illustrates the improved antifuse structure with via opening 35. Standard masking and etching techniques including reactive ion etching, plasma etching, among others, create via 35. Via 35 includes via sides 37 and bottom surface 41. Via sides 37 include two slopes but may also have a single slope or more than two slopes, depending upon the particular application. As shown, bottom surface 41 is concave in shape, and includes a relatively flat center portion 42 of the etch stop layer 29 and an edge portion 43 of sacrificial layer 31 having a sloped profile. It should be noted that if an etch stop layer is not used, the relatively flat center portion is a portion of barrier metal layer 27 and not etch stop layer 29. Alternatively, the relatively flat center portion may be a partially etched portion of sacrificial layer 31 as shown later in FIG. 6. The unique shape of the bottom surface tends to prevent sharp corners from forming near the via sides. By eliminating the sharp corners, the improved antifuse structure forms the programming link near the center portion which may draw more metal from its adjacent regions. Accordingly, the improved antifuse structure provides more consistent and reliable fuses.

The completed antifuse 45 is illustrated in FIG. 4. As shown, the completed antifuse includes a programming layer 47 formed over the dielectric layer and via. Programming layer 47 of amorphous silicon is typically deposited by plasma-enhanced chemical vapor deposition or the like. The thickness of the programming layer 47 is approximately 600 to 1200 Å with an atomic hydrogen content from 10–20% by composition. Of course, such thickness and hydrogen content of programming layer 47 depend on the desired programming voltage. Besides amorphous silicon for the programming layers, other nonconducting layers may be used, silicon dioxide, silicon nitride or undoped polysilicon may also used.

A second barrier metal layer 51, such as titanium tungsten or the like, is then sputtered over the programming layer 47. Such barrier metal layer must be thick enough to provide the desired amount of metal during programming to form a reliable conductive link. The thickness of barrier metal layer 51 also depends on the desired programming voltage. The barrier metal layer is then followed by another layer of aluminum alloy 53. The thicknesses of the layers 51 and 53 are about 500 to 1200 Å, and about 6,000 to 12,000 Å, respectively. The aluminum layer and barrier metal layer are then delineated by a mask to form a second metal interconnection line of the integrated circuit. This is shown in FIG. 4. Of course, not shown are the top barrier metal and passivation layers above the structure which typically follow in a semiconductor manufacturing process.

Figure 5:
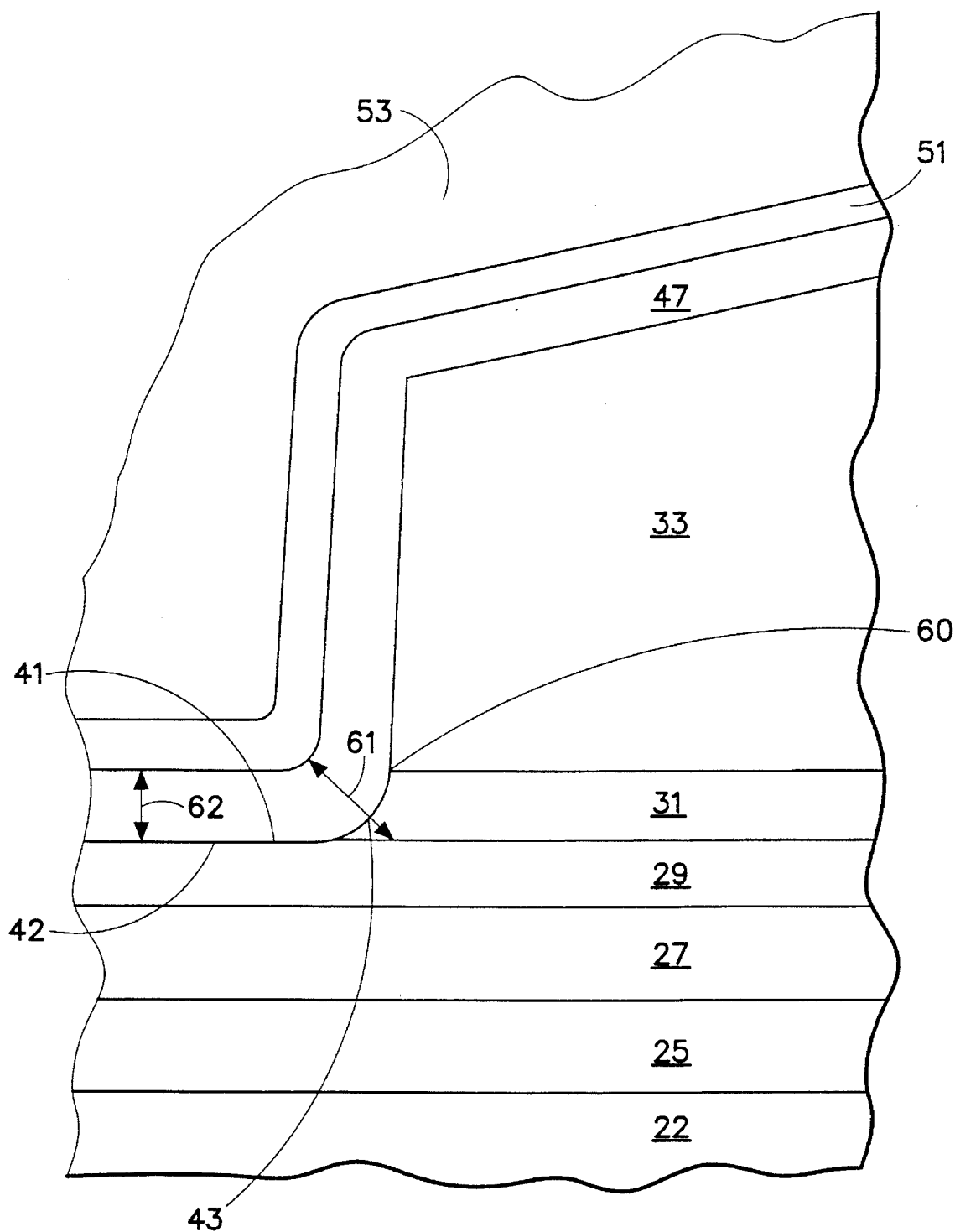
FIG. 5 is a detailed view of one corner of the antifuse structure of FIG. 4 according to the present invention.

FIG. 5 illustrates a detailed view of one corner region of an antifuse according to the present invention. Such detailed view of the corner region includes insulating layer 22, first metal interconnection layer 25, first barrier metal layer 27, etch stop layer 29, sacrificial layer 31, programming layer 47, dielectric layer 33, second barrier metal layer 51, and aluminum layer 53. Via 35 includes via side 37 and bottom surface 41. It should be noted that bottom surface 41 is concave in shape and provides a thicker effective programming layer near via corner region 60 which includes an edge portion 43 of sacrificial layer. Bottom surface 41 also provides a thinner effective programming layer over relatively flat center portion 42. Double-headed arrows 61 and 62 illustrate the effective thickness of the programming layer at corner region 60 and flat center portion 42, respectively. In one embodiment, the relatively flat center portion lies on a portion of the etch stop layer 29. Alternatively, relatively flat center portion may also lie on a portion of barrier metal layer 27. Still further, relatively flat center portion may lie on an etched portion of sacrificial layer 31 as shown later in FIG. 6. The unique structure of this antifuse promotes link formation during programming at the relatively flat center portion. The portion of the programming layer over the relatively flat center portion may access its adjacent regions for metal and thus forms an improved link structure. Such improved link structure provides lower programming voltages, more reliable link structures, and lower resistances after programming.

Figure 6:
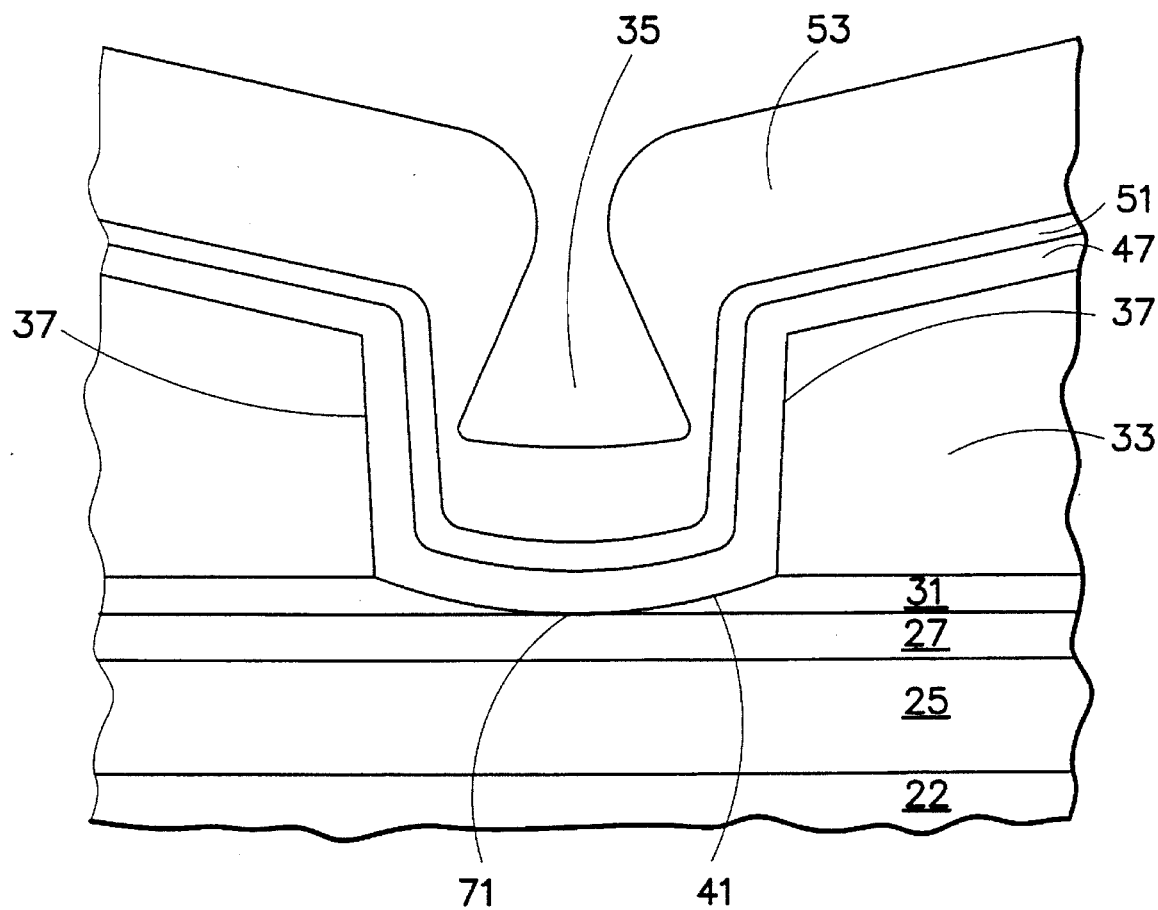
FIG. 6 is an alternative embodiment of the completed antifuse structure according to the present invention.

An alternative embodiment where sacrificial layer 31 is only partially removed along its layer region is shown in FIG. 6. Like the previous embodiment, insulating layer 22, first metal interconnection layer 25, first barrier metal layer 27, sacrificial layer 31, programming layer 47, dielectric layer 33, via 35, second barrier metal layer 51, and aluminum layer 53 are shown. Via 35 includes via sides 37 and bottom surface 41. It should be noted that bottom surface 41 includes a relatively flat center portion 71 located away from the via sides and lying on portion of sacrificial layer 31. Relatively flat center portion 71 is made by partially etching sacrificial layer 31 such that the effective programming layer near portion 71 is thinner than the other portion 73 of sacrificial layer near the via sides. Such thinner effective programming layer promotes programming near portion 71 which is away from the location near the via sides. Since the partial etching step does not terminate at barrier metal layer 51, no thin etch stop layer is typically needed in this embodiment.

The above description is illustrative and not restrictive. Many variations of the invention will become apparent to those of skill in the art upon review of this disclosure. Merely by way of example the invention is shown in context to an improved antifuse structure but may be implemented in other applications. The scope of the invention should, therefore, be determined not with reference to the above description, but instead should be determined with reference to the appended claims along with their full scope of equivalents.

What is claimed is:

1. An antifuse structure having a first insulating layer on a semiconductor substrate in an integrated circuit comprising:

a first metal interconnection line;

a sacrificial layer formed on said first metal interconnection line, said sacrificial layer having a first thickness;

a second insulating layer formed on said sacrificial layer;

an aperture having a bottom and sides through said second insulating layer, said bottom being concave and having sloped edge portions and a relatively flat center portion wherein said antifuse is to be located, said sloped edge portions defining sacrificial layer edge portions located between said sides and said relatively flat center portion, and said relatively flat center portion defining a first metal interconnection line portion located between said sloped edge portions;

a programming layer on said second insulating layer, said sides, and said bottom, said programming layer having a second thickness that is substantially uniform along said bottom, and said programming layer and said sacrificial layer being of different materials; and a second metal interconnection line on said programming layer; and whereby a thickness of said programming layer at said relatively flat center portion is much thinner than a combined thickness of said programming layer and said sacrificial layer at said sloped edge portions.

2. The antifuse structure of claim 1 wherein said first thickness is about 350 Å.

3. The antifuse structure of claim 1 wherein said sacrificial layer is selected from the group consisting of amorphous silicon, undoped polysilicon, silicon dioxide, and silicon nitride.

4. The antifuse structure of claim 1 wherein said programming layer is selected from the group consisting of amorphous silicon, undoped polysilicon, silicon dioxide, and silicon nitride.

5. The antifuse structure of claim 1 wherein said second metal interconnection line comprises a refractory metal layer.

6. The antifuse structure of claim 1 wherein said first thickness of said sacrificial layer is between about 100 and 500 Å.

7. The antifuse structure of claim 1 wherein said thickness of said programming layer is between about 600 and 1200 Å.

8. The antifuse structure of claim 1 wherein said insulating layer is selected from the group consisting of undoped silicate glass, borophosphosilicate glass (BPSG), and phosphosilicate glass (PSG).

9. The antifuse structure of claim 1 wherein said insulating layer has a thickness from about 5,000 to 10,000 Å.

10. The antifuse structure of claim 1 wherein said programming layer comprises amorphous silicon with an atomic hydrogen content from 10–20% by composition.

11. The antifuse structure of claim 1 wherein each of said first and said second metal interconnection lines comprises a refractory metal layer.

12. The antifuse structure of claim 11 wherein said refractory metal layer comprises titanium-tungsten.

13. The antifuse structure of claim 11 wherein said first metal interconnection line comprises a thin etch stop layer on said refractory metal layer.

14. The antifuse structure of claim 13 wherein said thin etch stop layer comprises aluminum.

15. The antifuse structure of claim 14 wherein said etch stop layer is about 200 to 400 Å thick.

16. The antifuse structure of claim 1 wherein said first metal interconnection line comprises a refractory metal layer.

17. The antifuse structure of claim 16 wherein said refractory metal layer comprises titanium-tungsten.

18. The antifuse structure of claim 16 wherein said first metal interconnection line comprises a thin etch stop layer on said refractory metal layer.

19. The antifuse structure of claim 18 wherein said etch stop layer comprises aluminum.

20. The antifuse structure of claim 19 wherein said etch stop layer is about 200 to 400 Å thick.

* * * * *